United States Patent
Wang

(10) Patent No.: US 6,620,527 B2
(45) Date of Patent: Sep. 16, 2003

(54) HILLOCK-FREE ALUMINUM WIRING LAYER AND METHOD OF FORMING THE SAME

(75) Inventor: Cheng-Chi Wang, Yungkang (TW)

(73) Assignee: Chi Mei Optoelectronics Corp. (TW)

(*) Notice: Subject to any disclaimer, the term of this patent is extended or adjusted under 35 U.S.C. 154(b) by 0 days.

(21) Appl. No.: 10/045,102

(22) Filed: Jan. 15, 2002

(65) Prior Publication Data

US 2003/0068522 A1 Apr. 10, 2003

(30) Foreign Application Priority Data

May 31, 2001 (TW) ....................... 90113275 A

(51) Int. Cl.$^7$ ................. B32B 15/20; C23C 14/00
(52) U.S. Cl. .......... 428/654; 204/192.11; 204/192.12; 204/192.15; 428/636; 428/686; 428/212; 428/218; 428/931
(58) Field of Search ................. 428/654, 636, 428/686, 212, 218, 931; 204/192.11, 192.12, 192.15

(56) References Cited

U.S. PATENT DOCUMENTS 6,033,542 A * 3/2000 Yamamoto et al. ......... 428/650
6,312,833 B1 * 11/2001 Tsuji et al. ................. 428/654

* cited by examiner

Primary Examiner—Robert R. Koehler
(74) Attorney, Agent, or Firm—Rabin & Berdo, PC

(57) ABSTRACT

A hillock-free wiring layer and method of forming the same are provided. The wiring layer includes at least two aluminum (Al) layers formed on a substrate, and each of the Al layers includes Al crystal particles. For any two Al layers of the wring layer, the one closer to the substrate is called the lower layer and the other one is called the higher layer. Besides, the Al crystal particles of the higher Al layer are larger and denser than that of the lower Al layer, and the lower Al layer has a higher resistance than that of the higher Al layer. By the invention, a wiring layer using either pure Al or an Al-based alloy is capable of preventing the occurrence of hillocks and reducing manufacturing cost.

16 Claims, 3 Drawing Sheets

HILLOCK-FREE ALUMINUM WIRING LAYER AND METHOD OF FORMING THE SAME

This application incorporates by reference Taiwanese application Serial No. 90113275, filed on May 31, 2001.

BACKGROUND OF THE INVENTION

1. Field of the Invention

The invention relates in general to an aluminum (Al) wiring layer, and more particularly to an aluminum wiring layer capable of preventing hillocks and a method of forming the same.

2. Description of the Related Art

As the semiconductor manufacturing of an integrated circuit (IC) with larger scale is required, a substrate may be insufficient to provide an enough area for forming required interconnects for the IC. In order to meet the requirement of the formation of increased numbers of interconnects due to the reduction of metal oxide semiconductors (MOSs) of the IC in sizes, two or more levels of metal layers for interconnects have become a necessary technology adopted in the manufacturing of many ICs. Particularly, for some integrated circuits with sophisticated functions such as microprocessors, four or five levels of metal layers are required to implement interconnections of the components of the integrated circuits. On the other hand, in the manufacturing of a thin-film transistor liquid crystal display (TFT-LCD) panel, thin metal films are employed as electrodes and interconnects, which are also formed in a structure with multiple levels of metal layers.

In a structure with multiple levels of metal layers, there are insulating layers, such as dielectrics, formed between any two of the metal layers in order to prevent an interlayer short circuit from occurring. In addition, a pure metal or an alloy with low electric resistance is suitably used as the material for the metal layers. In general, for examples of pure metals, Al, Cu, Mo, Ta, and W can be used. As examples of alloys with low electric resistance, an aluminum alloy containing one or more selected from the other elements, such as Al—Cu, Al—Cu—Si, Al—Pd, and Al—Nd, is used. Preferably, pure aluminum is employed as the material for metal layers. It is because aluminum has considerable adhesion with the substrate, and considerable etching characteristics in manufacturing as well as low electric resistivity. Besides, the earth contains much aluminum than other metal elements. Thus, aluminum is available and low in cost.

However, it still has disadvantages to use pure aluminum, which has a melting point lower than other metals, as the element for metal layers. Referring to FIG. 1A, it illustrates the deposition of a metal on a glass plate. In the manufacturing of thin film transistors, firstly, crystal particles 104 are formed on a glass plate 102 by the precipitation of metal under relatively low temperature (about 150° C.) and grain boundaries 106 are formed between the crystal particles. In fact, the crystal particles will not formed regularly in the same way as shown in FIG. 1A and the regular crystal particles shown in FIG. 1A are for the sake of illustration. Next, annealing is performed so that the increased vibration of the crystal particles by heating at high temperature causes the re-arrangement of the atoms of the crystal particles, thereby reducing defects of the crystal particles and re-crystallizing the crystal particles. After the re-crystallization, inner stress of the crystal particles is rapidly reduced by the reduction of the density of defects such as dislocation. If the annealing temperature is being increased and raises the crystal particles formed in the re-crystallization to a higher energy level exceeding the surface energy among the crystal particles, the crystal particles begin to grow while the smaller ones of them vanish. Consequently, the growth of the crystal particles yields larger crystal particles and the grain boundaries of the smaller crystal particles vanish. Thus, the inner stress of the crystal particles is further reduced to a lower level.

When pure aluminum is used as the wiring layer material, hillock and the like may be produced. FIG. 1B shows the hillock by illustrating the glass plate with pure aluminum as the wiring layer material after annealing. In the annealing, the high temperature causes the thermal expansion of Al crystal particle 104 and glass plate 102. Since aluminum has a greater thermal expansion coefficient than the glass, a substantial compressive stress by the Al crystal particle 104 is applied to the glass plate 102. By this compressive stress, the aluminum atoms move along grain boundary 106 to cause a hillock 110. The hillock and the like, such as the hillock 110, may cause the unevenness of the thickness of the other layers in the subsequent fabrication process. Besides, in the worse case, an interlayer short circuit may occur when a large hillock penetrates an insulting layer (not shown) to be formed between the underlying metal layer and the overlying metal layer, and touches the overlying metal layer.

Hence, it is necessary to solve the problem of hillock in order to use Al as the wiring material. Conventionally, there are three approaches to this problem. The first approach is to use the other element having a high melting point, such as Nd, Ti, Zr, Ta, Si, and Cu, as the wiring material. FIG. 2A shows that crystal particles 204 of an Al alloy formed on a glass plate 202 after annealing. As shown in FIG. 2A, there is no hillock formed among grain boundaries 206 of the crystal particles 204 of the Al alloy. Since the atoms of the additional element of the Al alloy cannot dissolve in Al crystal particles, as the crystal particles 204 grow, the atoms of the additional element move to the grain boundaries 206 and gradually form small particles 210 among the grain boundaries 206. Thus, when Al atoms move along the grain boundaries 206, the small particles 210 hinder the Al atoms from moving above the crystal particles 204, suppressing the formation of hillock.

The second approach is to form a metal layer with high melting point covering the Al crystal particles so as to suppress the growth of hillock. FIG. 2B illustrates a metal layer capping the Al crystal particles. After a metal layer 212 with a high melting point is plated over the Al crystal particles 204, annealing is performed. Since the metal layer 212 works as caps for covering the exits formed by the grain boundaries 206 among the Al crystal particles 204, Al atoms are blocked from forming hillocks along the grain boundaries 206. In addition, there is provided with a variant of the second approach where an Al layer in a single amorphous phase is substituted for the metal layer 212. The term "amorphous" indicates a non-crystalline state, that is, a state where there is no regulation in the atom array of the interior of a substance. Thus, the Al layer in a single amorphous phase has no crystal particle as a core for the growth of crystal particles and can be formed on the crystal particles 204 for the suppression of the formation of hillock.

In the third approach, an additional metal layer with a thermal expansion coefficient between that of the glass plate and Al is applied as a barrier to suppress the formation of hillock. As shown in FIG. 2C, a metal layer 214 is sandwiched between the glass plate 202 and the Al crystal particles 204. The metal layer 214 is first plated on the glass plate 202 and the Al crystal particles 204 are then formed on the metal layer 214. Besides, the metal layer 213 has a thermal expansion coefficient being greater than that of the glass plate 202 but smaller than that of the Al crystal particles 204. During annealing, the metal layer 214 acts as a buffer against the compressive stress due to a difference in thermal expansion coefficient between the glass plate and Al so as to prevent the Al atoms from moving along the grain boundaries 206 and forming hillocks.

For these three convention approaches to the problem of forming hillocks, it is the first one that is the most effective and usually employed. For example, a Japanese company, Kobelco, provides an Al—Nd alloy as the wiring material for metal layers, which is described in U.S. Pat. No. 6,033,542 to Yamamoto, et al. Nd has a large atomic weight and a high melting point, so that Nd can form small particles to hinder Al atoms from moving along the grain boundaries and forming hillocks. In this way, hillocks do not occur even if the temperature reaches 300° C. However, manufacturing cost is increased because Nd is a rare earth element, and it is required to apply a low sputtering rate in order to avoid splashing. Besides, Nd has a high resistivity so that an Al—Nd alloy has a resistivity higher than that of the pure aluminum.

As described above, the use of Al as wiring or electrode material in general semiconductor and liquid crystal display manufacturing is desired so that the study of the prevention of generating hillocks when Al is used therein is of great significant.

SUMMARY OF THE INVENTION

It is therefore an object of the invention to provide an aluminum (Al) wiring layer capable of preventing hillocks and a method of forming the same. Under different film formation conditions, a wiring layer with a multiple pure Al layers or with a multiple layers having substantially aluminum for its main component is formed and is capable of preventing the occurrence of hillocks on the surface of the wiring layer.

The invention achieves the above-identified object by providing a wiring layer including at least two metal layers formed on a substrate, wherein each metal layer has either pure Al or substantially Al for its main component. The metal layers include a first metal layer, which is formed on the substrate and includes a plurality of first Al crystal particles, and a second metal layer which is formed on the first metal layer and includes a plurality of second Al crystal particles. The second Al crystal particles of the second metal layer are substantially larger in size and are more densely distributed than the first Al crystal particles of the first Al layer. In this way, for any metal layer of the wiring layer, the closer to the substrate the metal layer is, the smaller in size and less densely distributed the Al crystal particles of that layer are. As a result, the pure Al layers of the wiring layer are capable of preventing hillocks.

The invention achieves the above-identified object by providing a method for forming a hillock-free wiring layer which is formed on a substrate and includes at least two metal layers, wherein each metal layer has either pure Al or substantially Al for its main component. The method includes the following steps. Under a first film formation pressure and a first film formation making power, a first metal layer of the wiring layer is formed on the substrate. Under a second film formation pressure and a second film formation making power, a second metal layer of the wiring layer is formed on the first pure Al layer. Besides, the second metal layer has a plurality of second Al crystal particles which are substantially larger in size than a plurality of first Al crystal particles of the first metal layer, and the second Al crystal particles of the second metal layer are more densely distributed than the first Al crystal particles of the first metal layer. In addition, the first metal layer has a resistance greater than a resistance of the second metal layer. The first and second film formation pressures are fixed in the respective steps and are at least about 4.0 Pa, while the first film formation sputtering power is smaller than the second film formation sputtering power.

BRIEF DESCRIPTION OF THE DRAWINGS

Other objects, features, and advantages of the invention will become apparent from the following detailed description of the preferred but non-limiting embodiments. The description is made with reference to the accompanying drawings described as follows.

DESCRIPTION OF THE PREFERRED EMBODIMENT

The characteristic of the invention is that a wiring layer having multiple metal layers is formed, under different film formation conditions, with either a plurality of pure aluminum (Al) layers or layers having substantially aluminum as main components of these layers. For this wiring layer, aluminum of each of the metal layers has its individual crystal phase, whereby the occurrence of hillocks is prevented.

Figure 3:
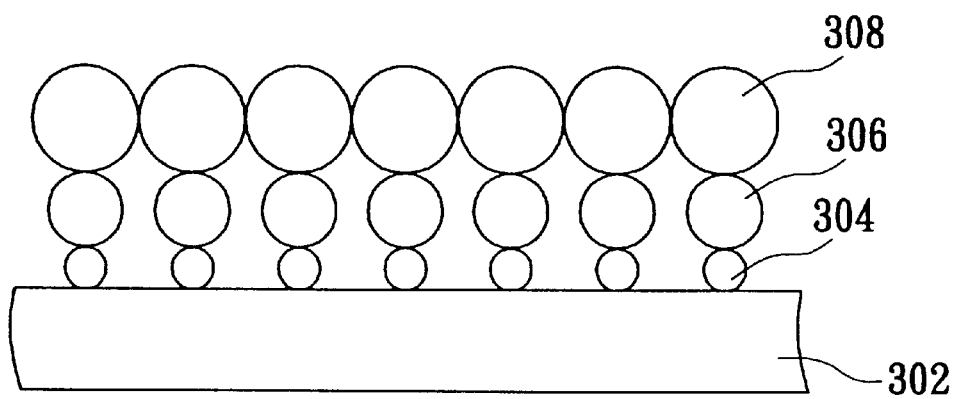
FIG. 3 is a diagram showing a wiring layer having multiple Al layers formed on a substrate, according to a preferred embodiment of the invention.

FIG. 3 shows a wiring layer with multiple pure Al layers formed on a substrate 302, wherein each of the pure Al layers has a plurality of crystal particles respectively and each of the pure Al layers may have very little impurity. On the substrate 302, the wiring layer is successively formed of at least two pure Al layers under different film formation conditions, wherein the pure Al layers have different crystal phases. In these multiple pure Al layers, the crystal particles are arranged gradually smaller in size and are less densely distributed from an upper to a lower layer. As shown in FIG. 3, there are three pure Al layers, namely, a lower, an intervening, and an upper layers, respectively having crystal particles 304, 306, and 308 with different sizes and density. The layer including the crystal particle of a smaller size has a larger electric resistance. Therefore, the lower layer including the crystal particles 304 has the largest electric resistance and the upper layer including the crystal particles 308 has the smallest electric resistance.

Figure 1A:
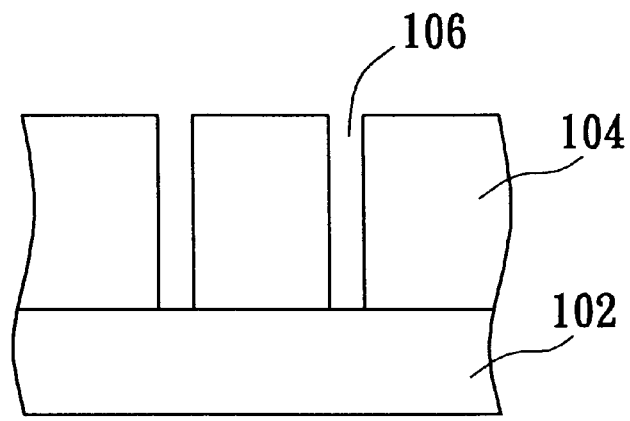
FIG. 1A (Prior Art) shows an example of the deposition of a metal on a glass plate.
Figure 1B:
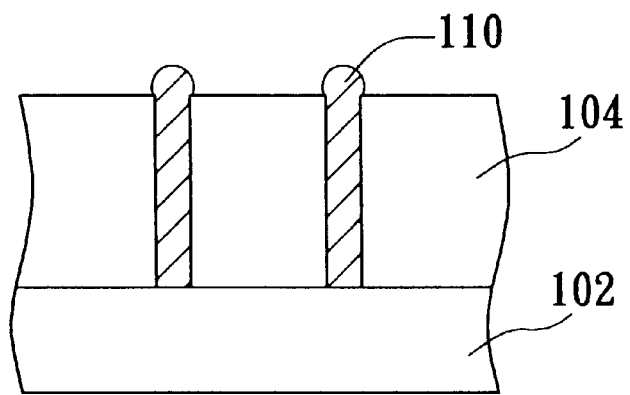
FIG. 1B (Prior Art) shows an example of hillocks which occur in an Al wiring layer formed on a glass plate after annealing.
Figure 2A:
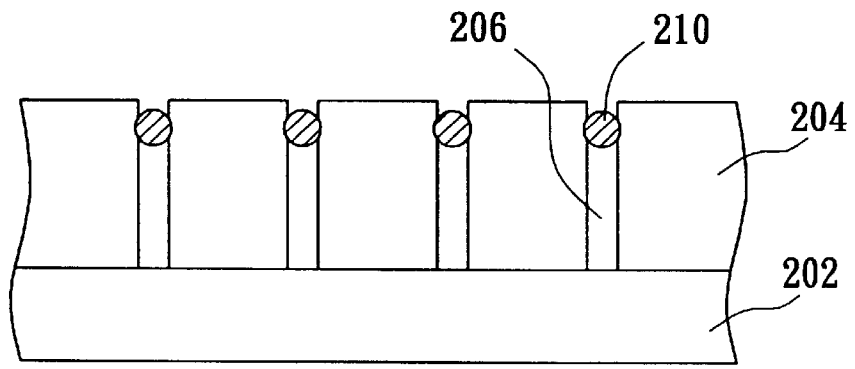
FIG. 2A (Prior Art) shows an example of crystal particles of an Al alloy formed on a glass plate after annealing.
Figure 2B:
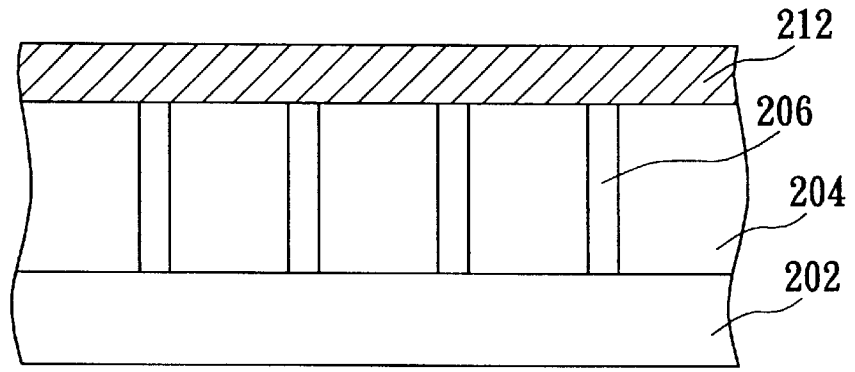
FIG. 2B (Prior Art) shows an example of a metal layer capping Al crystal particles formed on a glass plate.
Figure 2C:
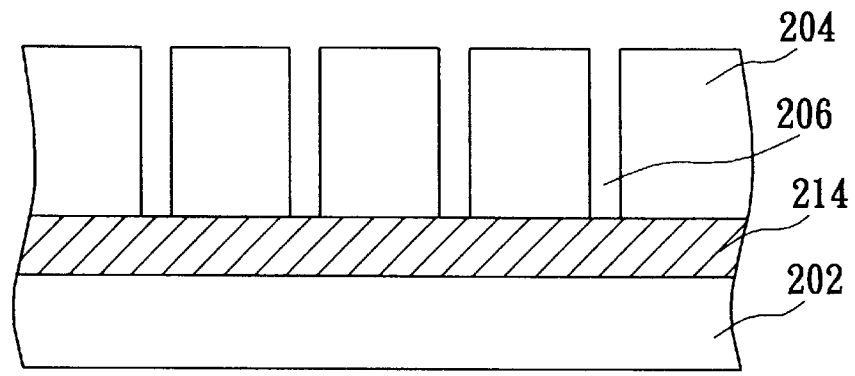
FIG. 2C (Prior Art) shows an example of a barrier metal layer sandwiched between a glass plate and Al crystal particles.

Since the formation of a wiring layer is a multiple Al layer structure, the Al layer disposed on the glass substrate substantially acts as a buffering layer, like the metal layer 214 shown in FIG. 2C, for preventing the occurrence of hillocks.

Although the wiring layer with three pure Al layers is illustrated in FIG. 3, the actual application could be two, four, five, or more Al layers. However, forming more Al layers will accordingly take more time in manufacturing process.

In the following, a series of tests with a multiple layer Al structure according to the invention are to be taken in order to show the effect of the invention on the prevention of hillocks. In addition, pure Al and an aluminum-neodymium alloy (Al-2.0% Nd) are put to the tests compared with the multiple layer Al structure, wherein Nd content percentage is 2.0 atomic %.

Embodiment I

Under a film formation pressure of 4.0 Pa and a sputtering power of 40 kW (film making power), a multiple layer Al, a single layer pure Al, and an Al—Nd alloy are deposited on the respective glass plates. These three samples are then annealed at a temperature of 350° C. for about one hour. By a scanning electron microscope, observations on the evenness of the Al layers are described in Table 1. From the observations, there is no hillock to be found on the multiple layer Al according to the invention as well as the Al-2.0% Nd according to the conventional method, while there are hillocks found on the surface of the single layer pure Al. Still further, an annealing temperature of 400° C. for about 1.5 hour is employed on the three samples for thermal resistance test. The observations on the thermal resistance of these samples are also shown in Table 1. From the observations, there is no hillock to be found on the multiple-layer Al according to the invention as well as the Al-2.0% Nd according to the conventional method.

From the above observations, it shows that the multiple-layer Al is effective in preventing hillocks.

TABLE 1

| Anneal condition | Single layer Al (Pure Al) | Al—Nd alloy (Al-2.0% Nd) | Multiple-layer Al |
|---|---|---|---|
| 350° C., 1 hr | x | o | o |
| 400° C., 1.5 hr | x | o | o | x: indicative of occurrence of hillocks; o: no hillock

Embodiment II

In this embodiment, before and after annealing, the measurement of the electric resistance of the multiple-layer Al, the single-layer pure Al, and the Al—Nd alloy is made and shown in Table 2. Before and after annealing, the single layer pure Al has a resistivity of about 3.2 $\mu\Omega$·cm to about 3.4 $\mu\Omega$·cm. For the Al—Nd alloy (Al-2.0% Nd) before annealing, it has a high electric resistance of about 10.3 $\mu\Omega$·cm. Although the resistivity of the Al—Nd alloy after annealing drops about one half of that before annealing, about 5.6 to about 5.7 $\mu\Omega$·cm, the resistivity after annealing is much greater than that of the single-layer pure Al. As for the multiple-layer Al according to the invention, before and after annealing, the multiple-layer Al has a low resistivity of less than about 4.0 $\mu\Omega$·cm. In this embodiment, the multiple-layer Al has a resistivity of about 3.5 to about 3.6 $\mu\Omega$·cm, which is close to that of the single-layer pure Al. Thus, the multiple-layer Al according to the invention has a low resistivity.

TABLE 2

| | Resistivity ($\mu\Omega$ · cm) | | |
|---|---|---|---|
| | Single layer Al (Pure Al) | Al—Nd alloy (Al-2.0% Nd) | Multiple-layer Al |
| Before annealing | 3.2~3.4 | 10.3 | 3.6 |
| After annealing | 3.2~3.4 | 5.6~5.7 | 3.5~3.6 |

According to Ohm's law, the resistance of a wire can be found from the equation R=$\rho$·L/A, where R is the resistance of the wire, $\rho$ is the resistivity of the wire, L is the length of the wire, and A is the cross-sectional area of the wire. Thus, if it is required that a wire layer of length L1 and resistance R1 is maintained and is now formed by another material having a lower resistivity, the cross-sectional area of the wire layer will be reduced according to Ohm's law. If it is required to substitute the multiple-layer Al for the Al—Nd alloy as wiring layers in a semiconductor manufacturing process for a circuit and the resistance of the wiring layers as using the Al—Nd alloy is required to be maintained, the wiring layers using the multiple-layer Al will have a smaller thickness or narrower line width than that using the Al—Nd alloy. Therefore, for the requirements for maintaining the substantially identical resistance of wiring layers formed by the Al—Nd alloy, substitution of the multiple-layer Al for the Al—Nd alloy results in an reduction in required thickness or line width of the multiple-layer Al film to be deposited onto the substrate.

Embodiment III

In the third embodiment, investigations are made on the effects of the multiple-layer Al structure imposed with different pressure under a regular film making power 40 kW.

The deposition of multiple-layer Al according to the invention is performed under film formation pressures of 0.3, 2.3, 3.5, 4.0, 4.5, and 5.5 Pa respectively. Observations on the evenness of the surface of the multiple-layer Al film are made after annealing.

TABLE 3

| | Multiple-layer Al | | | | | |
|---|---|---|---|---|---|---|
| Annealing condition | 5.5 Pa | 4.5 Pa | 4.0 Pa | 3.5 Pa | 2.3 Pa | 0.3 Pa |
| 350° C., 1 hr | o | o | o | x | x | x |
| 400° C., 1.5 hr | o | o | o | x | x | x | x: indicative of occurrence of hillocks; o: no hillock

In Table 3, it shows whether there is hillock occurred after annealing of the multiple-layer Al film under different film formation conditions. It shows that after annealing at an annealing temperature of about 350° C. for 1.0 hour or about 400° C. for 1.5 hour, hillocks occur if the multiple layers of Al are deposited onto the substrate under the film formation pressures 0.3, 2.3, and 3.5 Pa respectively. On the other hand, if the multiple layers of Al are deposited onto the substrate under the film formation pressures 4.0, 4.5, and 5.5 Pa respectively, no hillock occurs after annealing in the identical conditions. The greater the film formation pressure, the lower the Al deposition rate. Thus, under low film formation pressures, the multiple-layer structure is so denser that it is unable to form a structure with layer density increasing from the lower to the upper.

Therefore, the multiple-layer Al structure according to the invention requires high formation pressures of at least not less than about 4.0 Pa in order to prevent the occurrence of hillocks effectively.

Embodiment IV

This embodiment investigates the effect of the film formation making power on the formation of hillocks. In the investigation, two sets of multiple-layer Al structures are formed under two kind of film formation conditions respectively. In the formation of the first set of multiple-layer Al structures, as the film formation making power increases, the crystal particles formed by deposition becomes larger. In the formation of the second set of multiple-layer Al structures, as the film formation making power decreases, the crystal particles formed by deposition becomes smaller.

For the formation of the first set of multiple-layer Al structures, two layer Al, three layer Al, and five layer Al are deposited onto glass plates respectively and, for manufacturing processes of each multiple-layer Al structure, film formation making powers are increased with layer, increasing from lower to higher layers. For two layer Al, the crystal particles of the low and high layers are formed under film formation making powers of 16 kW and 40 kW respectively. For three layer Al, the crystal particles of the lower, intervening, and upper layers are formed under film formation making powers of 10, 16, and 40 kW respectively. For five layer Al, the crystal particles of the lowest to highest layers are formed under film formation making powers of 10, 15, 20, 30, and 40 kW respectively. In the first set of multiple-layer Al structures, the crystal particles increase in size from lower to higher layers.

On the other hand, for the formation of the second set of multiple-layer Al structures, two layer Al, three layer Al, and five layer Al are deposited onto glass plates respectively and, for manufacturing processes of each multiple-layer Al structure, film formation making powers are decreased with layer, decreasing from lower to higher layers. Besides, the film formation making powers for each of the second set of multiple-layer Al structures are identical to that for each of the first set of multiple-layer Al structures, but for each multiple-layer Al structure, the film formation making powers applied to the formation of Al layers of the multiple-layer Al structure are in reserve order. For example, in the formation of three-layer Al structure, the crystal particles of the lower, intervening, and upper layers are formed under film formation making powers of 40, 16, and 10 kW respectively. Thus, in the second set of multiple-layer Al structures, the crystal particles decrease in size from lower to higher layers.

The first and second sets of multiple-layer Al structures are then annealed at a temperature of 350° C. for one hour, and they are then observed as to whether hillocks occur. It is observed that there is no hillock occurred on each of the first set of multiple-layer Al structures. However, hillocks are found on the second set of multiple-layer Al structures.

From the above observations, as compared with the conventional technique of using the Al—Nd alloy such as Al-2.0% Nd, the use of multiple-layer Al structure according to the invention for wiring layers can lead to reduced process time and a reduced cost in a manufacturing process. In the conventional technique, the Al—Nd alloy is used for wiring layer material, where Nd is an expensive, rare earth element. In contrast, application of multiple deposition of pure Al to the formation of a wiring layer according to the invention is inexpensive than the conventional technique with Al—Nd alloy, where the earth is rich in Al and Al is much cheaper than Nd. In addition, the deposition rate of Al is higher than that of the Al—Nd alloy thereby resulting in time efficiency of manufacturing process.

Further, the multiple-layer Al structure has a low resistivity, and substantially has no hillock after annealing at a temperature of about 350 to about 400° C. It should be noted that in manufacturing a multiple-layer Al structure, it is necessary to form at least two Al layers on a glass plate. Besides, the film formation making powers for the Al layers of the multiple-layer structure are increased with layer, from lower to higher layers, so that the crystal particles of the Al layers increase in size with layer, from the lower to higher layers, while the formation of the multiple-layer structure should be under a film formation pressure of at least about 4.0 Pa, whereby the occurrence of hillocks are effectively prevented.

In the embodiments above, multiple layers of pure Al are deposited on a glass plate for the formation of a multiple-layer structure, resulting in the results as described. However, according to the principle of the invention that a multiple-layer structure is capable of preventing hillocks from occurring, a multiple-layer structure can also be formed with metal layers having substantially aluminum as main components of the metal layers in order to prevent the occurrence of hillocks. For instances, an alloy has substantially aluminum as its main component and has one or more other elements such as Ti, Ta, Si, Cu, or Nd as its additional component. According to the invention, the multiple successive deposition of Al alloy on the glass plate can form a multiple-layer Al alloy structure, where the crystal particles of the Al alloy layers of the multiple-layer Al alloy structure increase both in size and denseness of distribution but decrease in resistance with layer, from lower to higher layers. In this way, an Al wiring layer can be formed without hillocks.

In the multiple-layer structure according to the invention, all of the layers of the multiple-layer structure can be either pure Al layers, or layers of an Al alloy. In addition, a multiple-layer structure with different metal layers according to the invention can be formed so that the occurrence of hillocks is prevented. For example, an Al alloy layer can be first formed on a glass plate and one or more pure Al layers can be formed on the Al alloy layer. Another example is to form a pure Al layer on a glass plate and then form one or more alloy layers on the pure Al layer.

As the embodiments disclosed above, a wiring layer with a multiple-layer structure and a method of forming the same have the following advantages. As compared with the conventional technique of using the Al—Nd alloy such as Al-2.0% Nd, the use of multiple-layer structure according to the invention for wiring layers can reduce material cost, film thickness or line width of wiring layers, and manufacturing time. The invention can be applied to a wiring layer having substantially aluminum as its main component as well as pure Al wiring layer. In addition, wiring layers with the multiple-layer structure have low resistivity and are capable of preventing the occurrence of hillocks. Thus, by applying the invention to the manufacturing of wiring layers, interlayer short circuit due to hillocks and degrading effect of hillocks on the evenness of the successive layers will not occur. Hence, the total cost of the manufacturing process can be considerably reduced.

While the invention has been described by way of example and in terms of the preferred embodiment, it is to be understood that the invention is not limited to the disclosed embodiments. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A wiring layer comprising at least two pure aluminum (Al) layers formed on a substrate, wherein said at least two pure Al layers comprise:
   a first pure Al layer formed on the substrate, said first layer including a plurality of first Al crystal particles; and
   a second pure Al layer formed on the first pure Al layer, said second layer including a plurality of second Al crystal particles;
   wherein said second Al crystal particles are substantially larger in size than said first Al crystal particles, and said second Al crystal particles of said second pure Al layer are more densely arranged than said first Al crystal particles of said first pure Al layer;
   whereby said at least two pure Al layers of the wiring layer are capable of preventing hillocks.

2. A wiring layer according to claim 1, wherein said first pure Al layer has an electric resistance larger than that of said second pure Al layer.

3. A wiring layer according to claim 1, wherein said at least two pure layers have an electric resistance less than 4 $\mu\Omega$·cm.

4. A method for forming a hillock-free wiring layer, wherein said wiring layer is formed on a substrate and comprises at least two pure aluminum (Al) layers, the method comprising the steps of:
   under a first film formation pressure and a first film formation making power, forming a first pure Al layer on the substrate; and
   under a second film formation pressure and a second film formation making power, forming a second pure Al layer on said first pure Al layer; and
   wherein said second pure Al layer has a plurality of second Al crystal particles larger substantially in size than said first Al crystal particles of said first pure Al layer, and said second Al crystal particles of said second pure Al layer are more densely distributed than said first Al crystal particles of said first pure Al layer.

5. A method according to claim 4, wherein said first pure Al layer has an electric resistance larger than that of said second pure Al layer.

6. A method according to claim 4, wherein said first and second film formation pressures are not less than 4.0 Pa.

7. A method according to claim 4, wherein said first film making power is less than said second film making power.

8. A wiring layer comprising at least two layers formed on a substrate, wherein said at least two layers are substantially made of aluminum (Al), said at least two layers comprising:
   a first layer formed on the substrate and substantially having a plurality of first crystal particles; and
   a second layer formed on said first layer and substantially having a plurality of second crystal particles;
   wherein said second crystal particles are substantially larger in size than said first crystal particles, and said second crystal particles of said second layer are more densely distributed than said first crystal particles of said first layer;
   whereby said at least two layers of the wiring layer are capable of preventing hillocks.

9. A wiring layer according to claim 8, wherein both said first and second layers are made of Al alloys.

10. A wiring layer according to claim 8, wherein said first layer is an Al alloy layer and said second layers is a pure Al layer.

11. A wiring layer according to claim 8, wherein said first layer is a pure Al layer and said second layer is an Al alloy layer.

12. A wiring layer according to claim 8, wherein said Al alloy layer includes at least one additional element.

13. A wiring layer according to claim 12, wherein said at least one additional element comprise a rare earth element.

14. A wiring layer according to claim 13, wherein said rare earth element is neodymium (Nd).

15. A wiring layer according to claim 9, wherein said Al alloy layer includes at least one additional element.

16. A wiring layer according to claim 10, wherein said Al alloy layer includes at least one additional element.

* * * * *